United States Patent
Lee et al.

(10) Patent No.: US 7,411,796 B2
(45) Date of Patent: Aug. 12, 2008

(54) DISPLAY APPARATUS HAVING A DISPLAY MODULE THAT SUPPORTS VARIOUS FUNCTIONS

(75) Inventors: Jang-woo Lee, Seoul (KR); Ki-young Jang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/374,161

(22) Filed: Mar. 14, 2006

(65) Prior Publication Data

US 2007/0004253 A1    Jan. 4, 2007

(30) Foreign Application Priority Data

Jun. 30, 2005  (KR) ...................... 10-2005-0058101
Jun. 30, 2005  (KR) ...................... 10-2005-0058102

(51) Int. Cl.
  *H05K 7/02* (2006.01)
(52) U.S. Cl. ...................... 361/807; 361/753
(58) Field of Classification Search ................ 361/807, 361/810, 825, 829
  See application file for complete search history.

(56) References Cited

U.S. PATENT DOCUMENTS

| | | | |
|---|---|---|---|
| 6,162,089 A | 12/2000 | Costello et al. | |
| 6,361,332 B1 | 3/2002 | Froude et al. | |
| 6,452,790 B1 * | 9/2002 | Chu et al. | 361/683 |
| 6,813,159 B2 * | 11/2004 | Irie et al. | 361/752 |
| 2004/0109300 A1 * | 6/2004 | Fujii et al. | 361/810 |
| 2005/0225949 A1 * | 10/2005 | Kollmannsberger et al. | 361/728 |

FOREIGN PATENT DOCUMENTS

| | | | |
|---|---|---|---|
| JP | 2002-189462 | * | 7/2002 |
| JP | 2003-208951 | | 7/2003 |
| KR | 100136466 B1 | | 1/1998 |
| KR | 100332964 | | 4/2002 |
| KR | 1020030072808 | | 9/2003 |
| KR | 1020040032208 | | 4/2004 |

* cited by examiner

*Primary Examiner*—Tuan Dinh
*Assistant Examiner*—Yuriy Semenenko
(74) *Attorney, Agent, or Firm*—Stanzione & Kim, LLP (57) ABSTRACT

A display apparatus having a display module to display images includes a first printed circuit board arranged on a rear side of the display module, a shielding cover to shield a rear side of the first printed circuit board to accommodate the first printed circuit board therein, a first connection port mounted on the first printed circuit board at an edge portion thereof and projected from a surface of the first printed circuit board, at least one second connection port mounted on the first printed circuit board adjacent to the first connection port and projected from the surface of the first printed circuit board by a second height different from the first height of the first connection port, a grounding bracket combined with the first printed circuit board and disposed over the first and second connection ports to be in contact with the first connection port, a second grounding plate arranged between the grounding bracket and the second connection port to be in contact with the grounding bracket and the second connection port, and a first grounding plate disposed between the shielding cover and the grounding bracket to be in contact with the shielding cover and the grounding bracket so that the grounding bracket is grounded to the shielding cover.

8 Claims, 7 Drawing Sheets

DISPLAY APPARATUS HAVING A DISPLAY MODULE THAT SUPPORTS VARIOUS FUNCTIONS

CROSS-REFERENCE TO RELATED APPLICATIONS

This application claims the benefit under 35 U.S.C. § 119 from Korean Patent Application No. 2005-0058102, filed on Jun. 30, 2005, and No. 2005-0058101, filed on Jun. 30, 2005, in the Korean Intellectual Property Office, the entire disclosures of which are incorporated herein by reference.

BACKGROUND OF THE INVENTION

1. Field of the Invention

The present general inventive concept relates to a display apparatus, and more particularly, to a display apparatus having a display module that supports various functions in which printed circuit board components of the display apparatus and/or a grounding structure of the display apparatus are arranged to reduce interference and provide an optimum layout of connecting ports mounted on the printed circuit board.

2. Description of the Related Art

Generally, display apparatuses including liquid crystal displays (LCD) and plasma display panels (PDP) are used as a television or a computer monitor to display images.

Monitors now offer additional functions such as a TV screen function implemented by having a TV-broadcast receiving tuner included therein for receiving and displaying a TV broadcast signal, and an audio system function implemented by having a speaker included therein for outputting sound from a computer. These additional functions of the monitor are offered in addition to a displaying function for displaying images by converting image signals from the computer. Such a monitor with a variety of additional functions is called a multi function monitor.

The computer and monitor are typically connected to each other via a D-Sub connector or a digital visual interface (DVI) connector to allow image signals from the computer to be transmitted to the monitor.

The multi function monitor can have the D-Sub and/or DVI connectors, and further have an S-video connector, a component connector or a composite connector besides the D-sub connector or the DVI connector to receive the image signals from an external image processing apparatus such as a DVD apparatus, a VCR, etc.

In conventional computers, only one output connector, such as the D-sub connector, has been supported by the computer, but recently there is a trend that two or more output connectors including the D-sub connector, the DVI connector and the S-video connector are supported by the computer, and thus two or more monitors can be connected to one computer.

Recently, the multi function monitors that have been commercialized are provided with more additional functions such as a network function to connect the monitors to a network, thereby displaying data received through the network as images, and sending and receiving control signals via the network. In addition to the network function, the monitor still functions as a computer monitor by being connected to the computer via an image cable.

In the multi function monitors having a network function, a circuit block supporting the network function is mounted on an additional printed circuit board (hereinafter, referred to as "sub printed circuit board") installed in a base stand of a conventional monitor. In addition to the sub printed circuit board, the conventional monitor also includes a primary printed circuit board (hereinafter, referred to as "primary printed circuit board") installed in a main body of the conventional monitor.

To process data received through the network and transmit the processed data to a display module, the sub printed circuit board provided in the base stand and the primary printed circuit board provided in the main body of the monitor are connected to each other via a cable.

In the monitors having the configuration stated above, since the sub printed circuit board is located in the base stand, the base stand has a larger volume. Such a large volume is not preferable in the current industry environment emphasizing a smaller sized product design.

Moreover, the multi function monitor having the configuration stated above is disadvantageous that an additional space is required in the base stand and the main body of the monitor for the cable to connect the primary printed circuit board and the sub printed circuit board to each other. The cable is likely to be damaged by movement of mechanical structures of the monitor, and the cable serves as a limitation in designing the mechanical structures of the monitor.

On the other hand, the multi function monitor typically is provided with a plurality of input/output connection ports to enable the variety of additional functions to be used with the monitor. Each input/output connection port solves an electrostatic discharge (ESD) or electromagnetic interference (EMI) problem by using a grounding structure.

In such multi function monitors, ESD or EMI may occur when the plurality of input/output connection ports are arranged close to each other. Further, since each input/output port has a different size, an identical grounding structure can not be applied to all the input/output connection ports.

SUMMARY OF THE INVENTION

The present general inventive concept provides a display apparatus in which a height difference of connection ports mounted on a printed circuit board and projected with different heights is compensated, connection ports can be easily grounded, and assembly work efficiency of the display apparatus can be enhanced.

The present general inventive concept may also provide a display apparatus having a network function by which data transmission/reception can be performed, and which uses one printed circuit board on which a first circuit block that processes image signals and a second circuit block that processes data received or transmitted through a network are mounted.

The present general inventive concept may further provide a display apparatus in which a first circuit block and a second circuit block are mounted on one printed circuit board without having an overheating problem therebetween.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing a display apparatus having a display module to display images, the display apparatus comprising a first printed circuit board arranged on a rear side of the display module, a shielding cover to shield a rear side of the first printed circuit board to accommodate the first printed circuit board therein, a first connection port mounted on the first printed circuit board at an edge portion thereof and projected from a surface of the first printed circuit board by a first height, at least one second connection port mounted on the first printed circuit board adjacent to the first connection port and projected from the surface of the first printed circuit board by a second height different from the first height of the first connection port, a grounding bracket combined with the first printed circuit board to surround the first and second connection ports and to be in contact with the first connection port, a second grounding plate arranged between the grounding bracket and the second connection port to be in contact with the grounding bracket and the second connection port, and a first grounding plate disposed between the shielding cover and the grounding bracket to be in contact with the shielding cover and the grounding bracket so that the grounding bracket is grounded to the shielding cover.

The first connection port may comprise a local area network (LAN) port and the second connection port may comprise a universal serial bus (USB) port.

The display apparatus may further comprise a board support frame arranged between the display module and the first printed circuit board to support the first printed circuit board.

The board support frame may comprise a base plate to seat the first printed circuit board thereon, and an extended plate bent from an end of the base plate and provided with a port expose hole through which the first and second connection ports are exposed.

The second grounding plate may comprise a second clip portion to be combined with the grounding bracket so that the grounding bracket is inserted into the second clip portion, and a second contact portion to extend from the second clip portion toward the second connection port to be in contact with the second connection port when the second clip portion is combined with the grounding bracket.

The first grounding plate may comprise a first clip portion to be in contact with the shielding cover, and to be combined with the board support frame so that the board support frame is inserted into the first clip portion, and a first contact portion to extend from the first clip portion toward the grounding bracket to be in contact with the grounding bracket when the first clip portion is combined with the shielding cover and the board support frame.

The extended plate may comprise a bent portion at its end portion, the bent portion being bent toward the first printed circuit board the first grounding plate comprises a first clip portion to be combined with the board support frame so that the bent portion of the extended plate is inserted into the first clip portion, and a first contact portion to extend from the first clip portion toward the grounding bracket to be in contact with the grounding bracket when the first clip portion is combined with the board support frame, and the first clip portion is grounded by being in contact with the shielding cover.

The display apparatus may further comprise a second printed circuit board combined with a rear side of the board support frame adjacent to the first printed circuit board such that a plurality of power supply circuit devices are mounted on the second printed circuit board.

The first printed circuit board may comprise a first circuit block mounted thereon to supply image signals to the display module and a second circuit block to process data received and transmitted through a network, the first printed circuit board comprises first and second sides opposite to each other, and the second circuit block is mounted from an edge portion of the second side of the first printed circuit board where the first side is a side adjacent to the second printed circuit board.

The second circuit block may comprise a network control block connected to the network to transmit and receive data according to a predetermined communication protocol, a data storage block which stores at least one control routine to process the data received and transmitted through the network control block, a memory block into which the control routine is loaded, a main processor to load the control routine into the memory block and execute the control routine, and a bridge block to manage an exchange of the data between the main processor and the data storage block.

The main processor may be arranged at a position adjacent to the second side of the first printed circuit board.

The main processor may convert the data received through the network control block to video signals and outputs the video signals to the first circuit block.

The LAN port and the USB port may be mounted on an edge portion of a third side of the first printed circuit board.

The first printed circuit board may comprise an image input port mounted on the edge portion thereof to receive input image signals input to the first circuit block, and an image output port mounted on the edge portion thereof to output image signals from the first circuit block.

The first printed circuit board may further comprise a low voltage differential signaling (LVDS) output connector mounted on an edge portion of a fourth side thereof to transmit the output image signals from the first circuit block to the display module.

The second circuit block may further comprise an initializing routine block to initialize the second block when the initializing power is inputted thereto and a transition minimized differential signaling (TMDS) transmission block to convert image signals output from the main processor in a TMDS format and output the converted image signals to the first circuit block, and the network control block, the data storage block, the memory block, the initializing routine block and the TMDS transmission block are mounted on the first printed circuit board adjacent to the main processor.

The foregoing and/or other aspects of the present general inventive concept may also be achieved by providing a display apparatus having a display module to display images, the display apparatus comprising a board support frame arranged at a rear side of the display module, a second printed circuit board attached to a rear surface of the board support frame and provided with a plurality of power supply circuit devices, and a first printed circuit board attached to the rear surface of the board support frame near the second printed circuit board, having a first side disposed adjacent to the second circuit board and a second side opposite to the first side, and having a first circuit block to supply image signals to the display module and a second circuit block to process data received and transmitted through a network, the second circuit block being arranged on the first printed circuit board from an edge portion of the second side opposite to the first side of the first printed circuit board.

The second circuit block may comprise a network control block connected to a network to transmit and receive data according to a predetermined communication protocol, a data storage block which stores at least one control routine to process the data received and transmitted through the network control block, a memory block into which the control routine is loaded, a main processor to load the control routine into the memory block and to execute the control routine, and a bridge block to manage an exchange of the data between the main processor and the data storage block.

The main processor may be arranged at a position adjacent to the second side of the first printed circuit board.

The main processor may convert the data received through the network control block to video signals, and output the video signals to the first circuit block.

The first printed circuit board may comprise an LAN port mounted on an edge portion of a third side thereof to be connected to an external LAN connector and at least one USB port mounted on the edge portion of at least one of the second side and the third side thereof to be connected to an external device supporting a USB interface.

The first printed circuit board may comprise an image input port mounted on the edge portion of the third side thereof to receive input image signals input to the first circuit block and an image output port mounted on the edge portion of the third side thereof to output image signals from the first circuit block to an outside of the first printed circuit board.

The first printed circuit board may further comprise an LVDS output connector mounted on an edge portion of a fourth side thereof to transmit the image signals from the first circuit block to the display module.

The second circuit block may comprise an initializing routine block to initialize the second block when the initializing power is inputted thereto and a TMDS transmission block to convert image signals output from the main processor in a TMDS format and output the converted image signals to the first circuit block, and the network control block, the data storage block, the memory block, the initializing routine block, and the TMDS transmission block are mounted on the first printed circuit board adjacent to the main processor.

The foregoing and/or other aspects of the present general inventive concept may also be achieved by providing a display apparatus having a display module to display images, the apparatus comprising a board support frame arranged at a rear side of the display module, a second printed circuit board attached to a rear surface of the board support frame and provided with a plurality of power supply circuit devices, a first printed circuit board attached to the rear surface of the board support frame near the second printed circuit board, having a first side disposed adjacent to the second printed circuit board and a second side opposite to the first side, and having a first circuit block to supply image signals to the display module and a second circuit block to process data received and transmitted through a network, the second circuit block being arranged on the first printed circuit board from an edge portion of the second side opposite to the first side of the first printed circuit board, a shielding cover to shield a rear side of the first printed circuit board to accommodate the first printed circuit board therein, a first connection port mounted on the first printed circuit board at an edge portion thereof and projected from a surface of the first printed circuit board by a first height, at least one second connection port mounted on the first printed circuit board adjacent to the first connection port and projected from the surface of the first printed circuit board by a second height different from the first height of the first connection port, a grounding bracket combined with the first printed circuit board and disposed over the first and second connection ports to be in contact with the first connection port, a second grounding plate arranged between the grounding bracket and the second connection port to be in contact with the grounding bracket and the second connection port, and a first grounding plate disposed between the shielding cover and the grounding bracket to be in contact with the shielding cover and the grounding bracket so that the grounding bracket is grounded to the shielding cover.

The foregoing and/or other aspects of the present general inventive concept may also be achieved by providing a display apparatus comprising a circuit board disposed inside of the display apparatus, first and second connection ports projecting from a surface of the circuit board by first and second heights to connect the display apparatus to at least one of an external network and a peripheral device, a shielding cover to provide a ground, and a grounding bracket disposed between the shielding cover and the first and second connection ports, to be in contact with the shielding cover, spaced-apart from the circuit board by a third height, such that a middle planar portion of the grounding bracket is in contact with at least one surface of the first and second connection ports, and first and second grounding plates both in contact with the grounding bracket, the first grounding plate being in contact with at least one of the communication ports, and the second grounding plate being in contact with the shielding cover.

BRIEF DESCRIPTION OF THE DRAWINGS

The above and/or other aspects and advantages of the prevent general inventive concept will become apparent and more readily appreciated from the following description of the exemplary embodiments, taken in conjunction with the accompany drawings, in which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Figure 1:
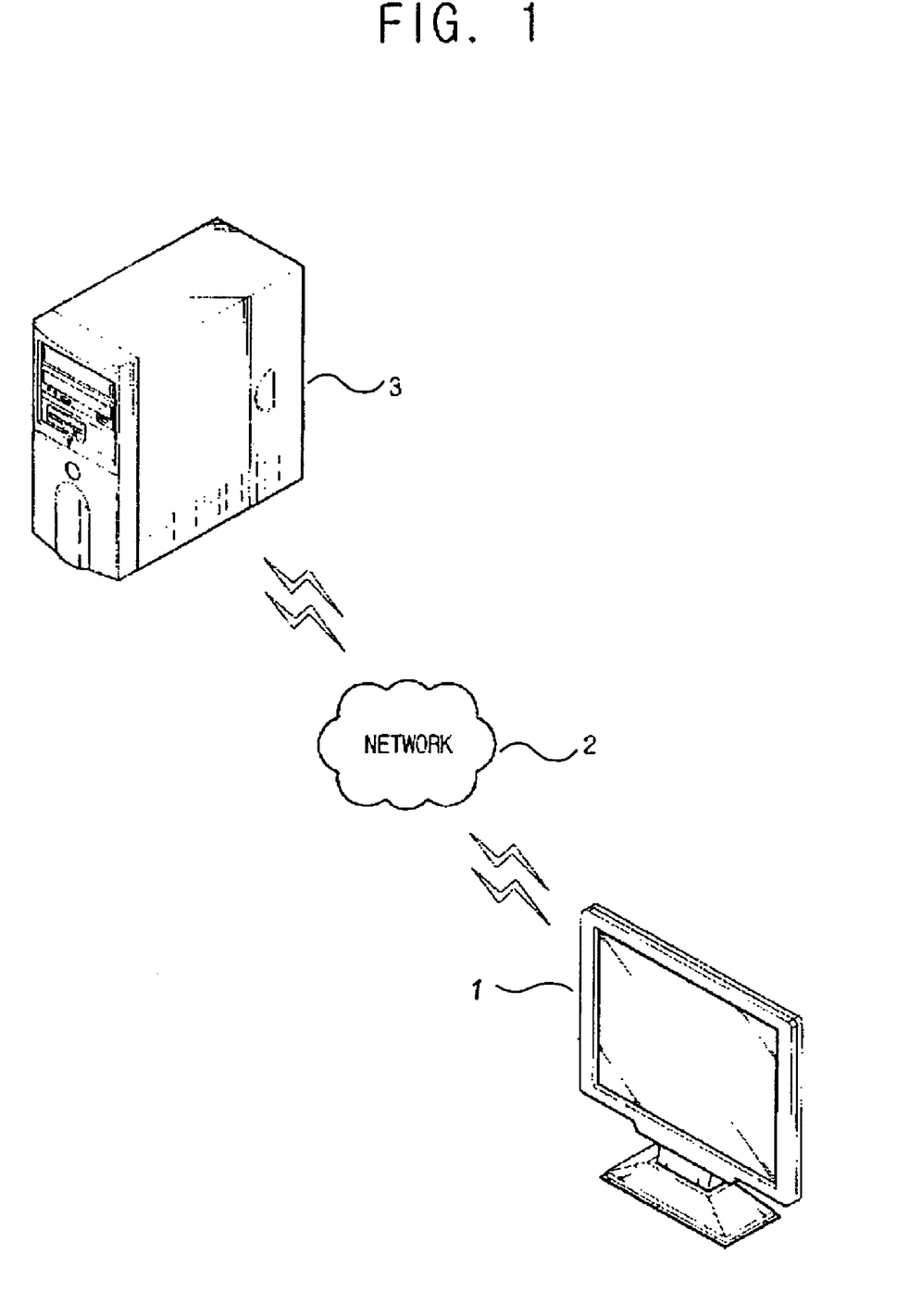
FIG. 1 is a diagram illustrating a connection between a display apparatus and a computer according to an embodiment of the present general inventive concept.

Referring to FIG. 1, a display apparatus 1 according to an embodiment of the present general inventive concept is connected to an external device, for example, to a computer 3, through a network 2.

Figure 2:
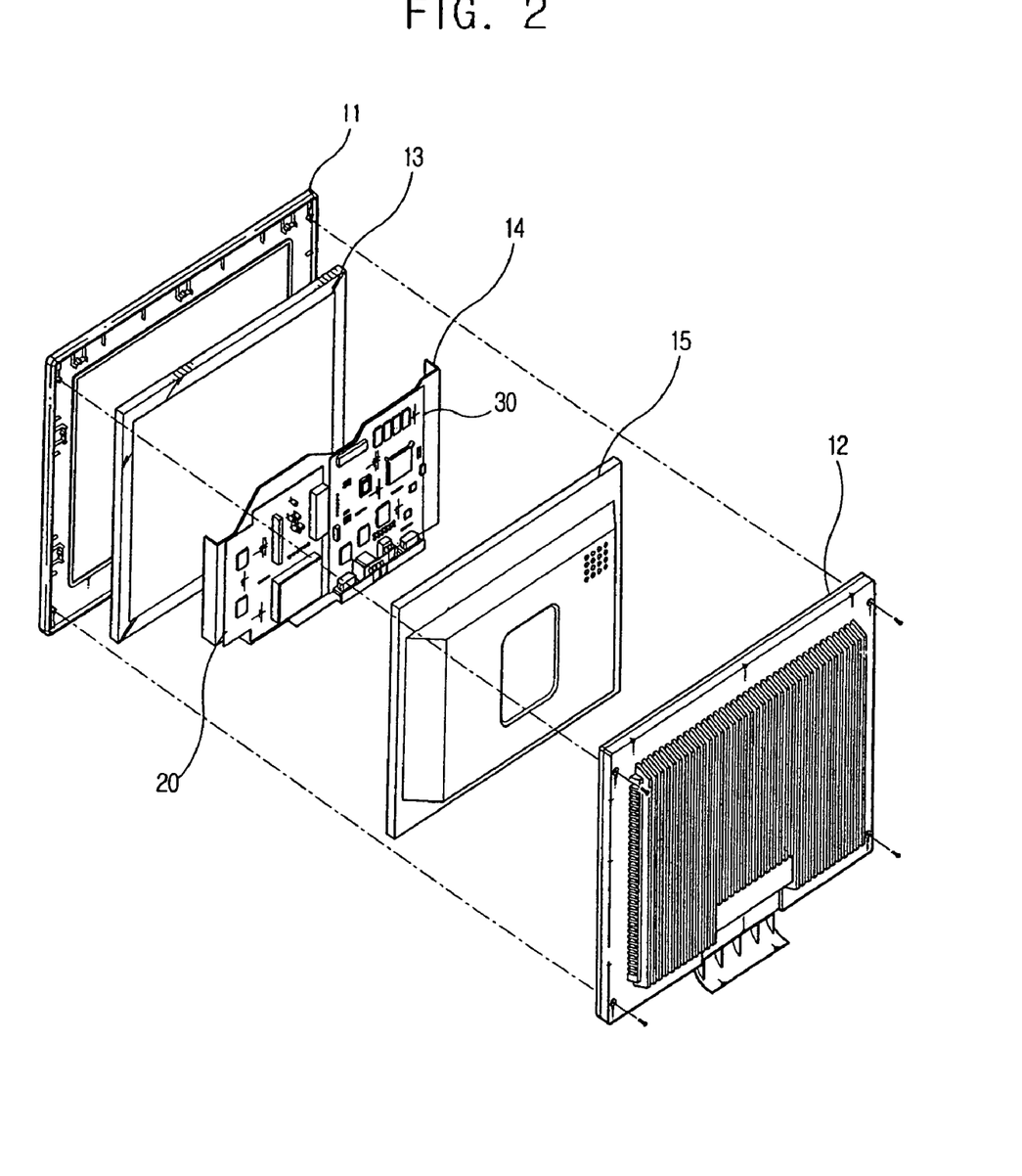
FIG. 2 is an exploded perspective view illustrating the display apparatus of FIG. 1.

Referring to FIG. 2, the display apparatus 1 according to the present embodiment the present general inventive concept includes a front cover 11 and a rear cover 12 combined with each other to provide a space therebetween, a display module 13 to display an image, a board support frame 14 arranged on a rear side of the display module 13, a second printed circuit board 20 and a first printed circuit board 30 provided on a rear surface of the board support frame 14, and a shielding cover 15 coupled to a rear side of the board support frame 14 to shield the first and second printed circuit boards 30 and 20.

The front cover 11 has a display window on a surface thereof to allow images displayed by the display module 13 to be exposed. The front cover 11 and the rear cover 12 are combined with each other to accommodate the display module 13, the board support frame 14, and the shielding cover 15, thereby constituting an outer housing.

The display module 13 may be a flat panel display module including a LCD type, a PDP type, an organic electro luminance (EL) type, etc.

The board support frame 14 is combined with the front cover 11 to be disposed on the rear side of the display module 13. The board support frame 14 may be combined with the front cover 11, and separated from the rear side of the display module 13 by a distance. Accordingly, interference generated between the display module 13 and the first and second printed circuit boards 30 and 20, by, for example, heat and/or signal noise may be reduced.

The board support frame 14 may have a boss (or protuberantly formed member) projected toward the display module 13 on a front surface thereof to maintain a distance between the board support frame 14 and the display module 13. Alternatively, the board support frame 14 may have lateral edges bent forward on opposite sides thereof, instead of the boss to separate the board support frame 14 from the display module 13.

Figure 5:
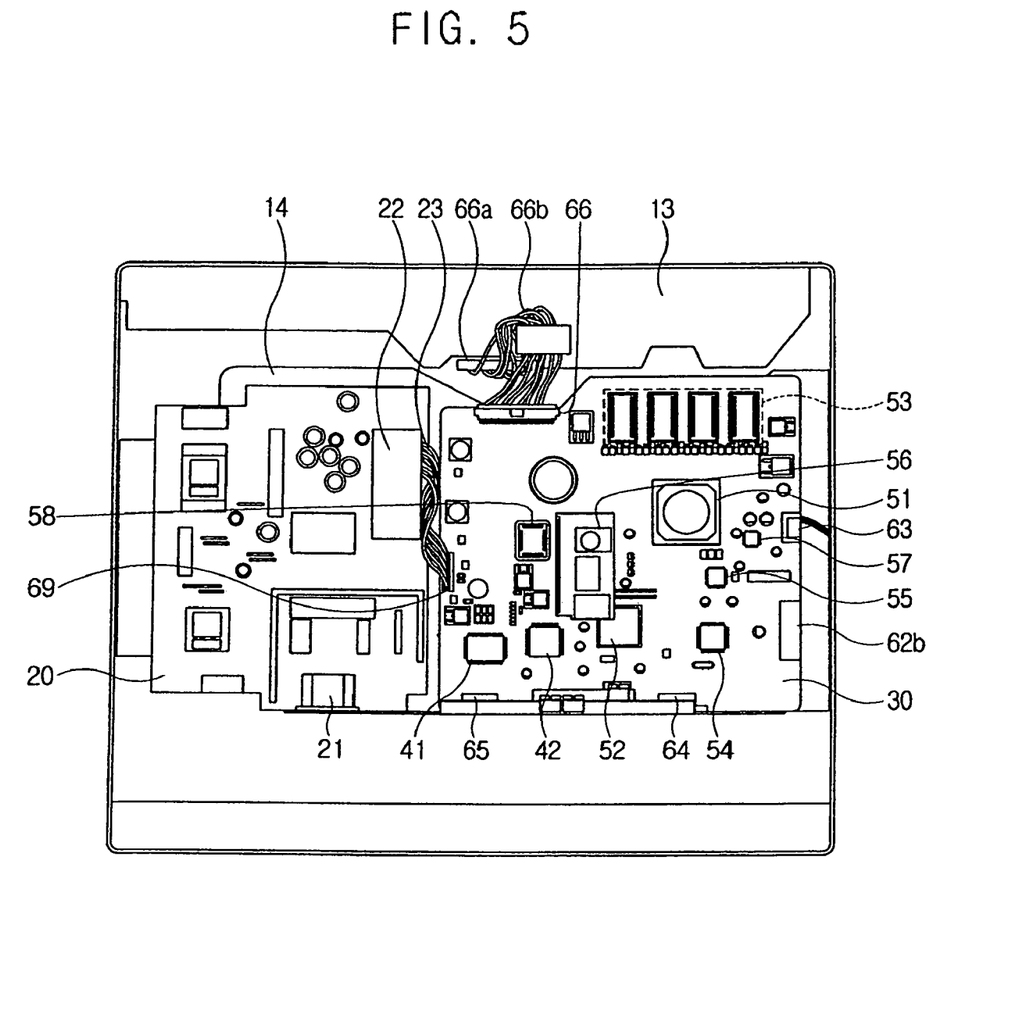
FIG. 5 is a diagram illustrating a connection of the first printed circuit board and a second printed circuit board combined with a board support frame in the display apparatus of FIGS. 2 and 3.

As illustrated in FIGS. 2 and 5, the second printed circuit board 20 and the first printed circuit board 30 adjacent to the second printed circuit board 20 are combined together on the rear side of the board support frame 14. When the display apparatus 1 is viewed from a rear side thereof, the second printed circuit board 20 is arranged on a left side of the board support frame 14 and the first printed circuit board 30 is arranged on a right side of the board support frame 14, while the second and third printed circuit boards 20 and 30 are arranged on the rear surface of the board support frame 14.

On the second printed circuit board 20 is mounted a plurality of power supply circuit devices needed to drive the display apparatus 1. That is, the plurality of power supply circuit devices may include a power connector 21 mounted at a lower edge of the second printed circuit board 20 and exposed to an outside when the shielding cover 15 and the rear cover 12 are combined together, as illustrated in FIG. 5.

The second printed circuit board 20 may further include power conversion circuit blocks such as a DC/DC regulator which converts a power externally input through the power connector 21 to a driving voltage needed to power the display module 13, and a first circuit block 40 and a second circuit block 50 mounted on the first printed circuit board 30.

On the second printed circuit board 20, as illustrated in FIG. 5, at an edge portion of a side near the first printed circuit board 30, a power output connector 22 may be provided to supply a power to drive the first and second circuit blocks 40 and 50 mounted on the first printed circuit board 30. The power output connector 22 may be connected to a power input connector 69 on the first printed circuit board 30 by a cable 23 to supply a power to the first printed circuit board 30.

Figure 3:
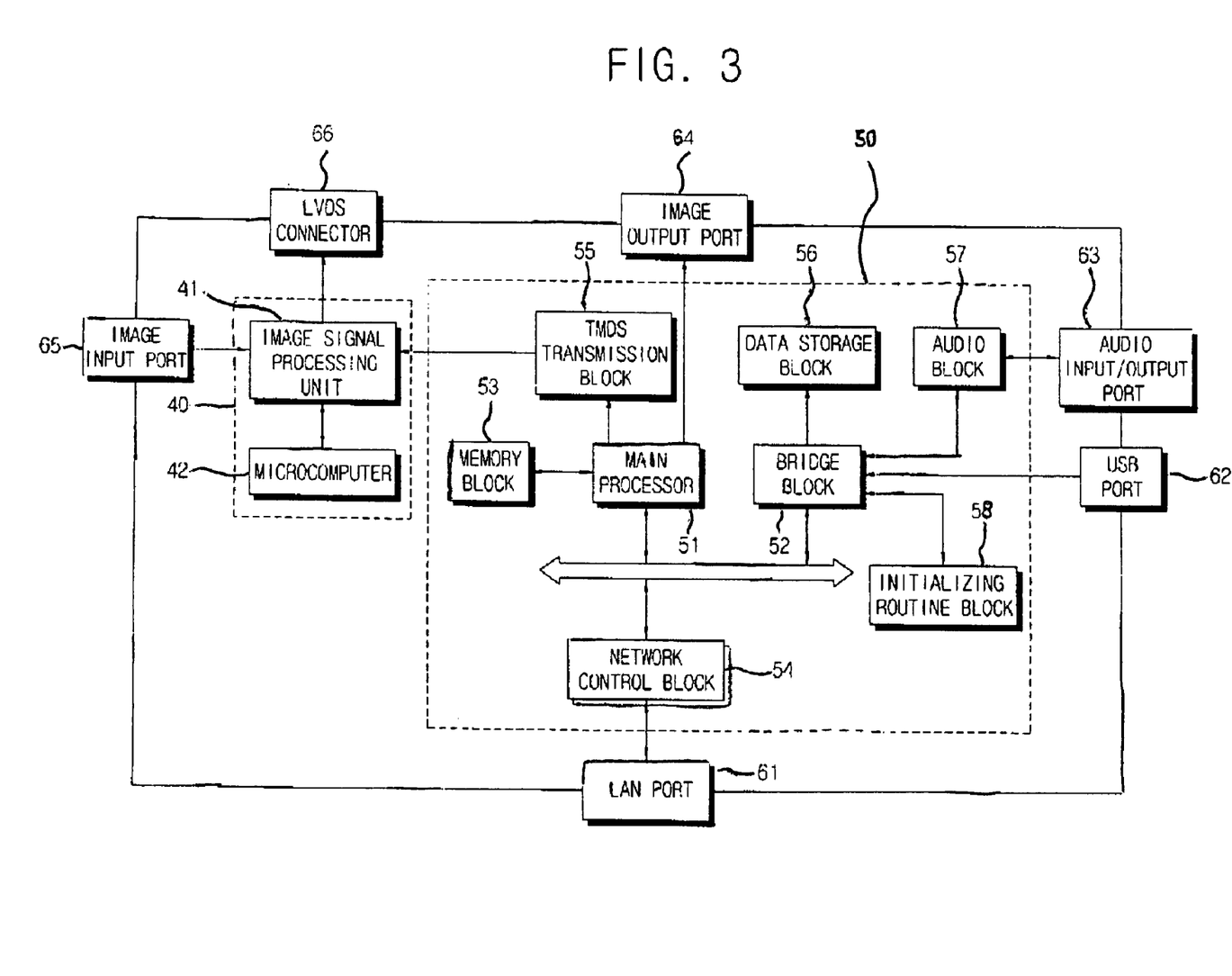
FIG. 3 is a block diagram illustrating a control of the display apparatus of FIG. 2.
Figure 4:
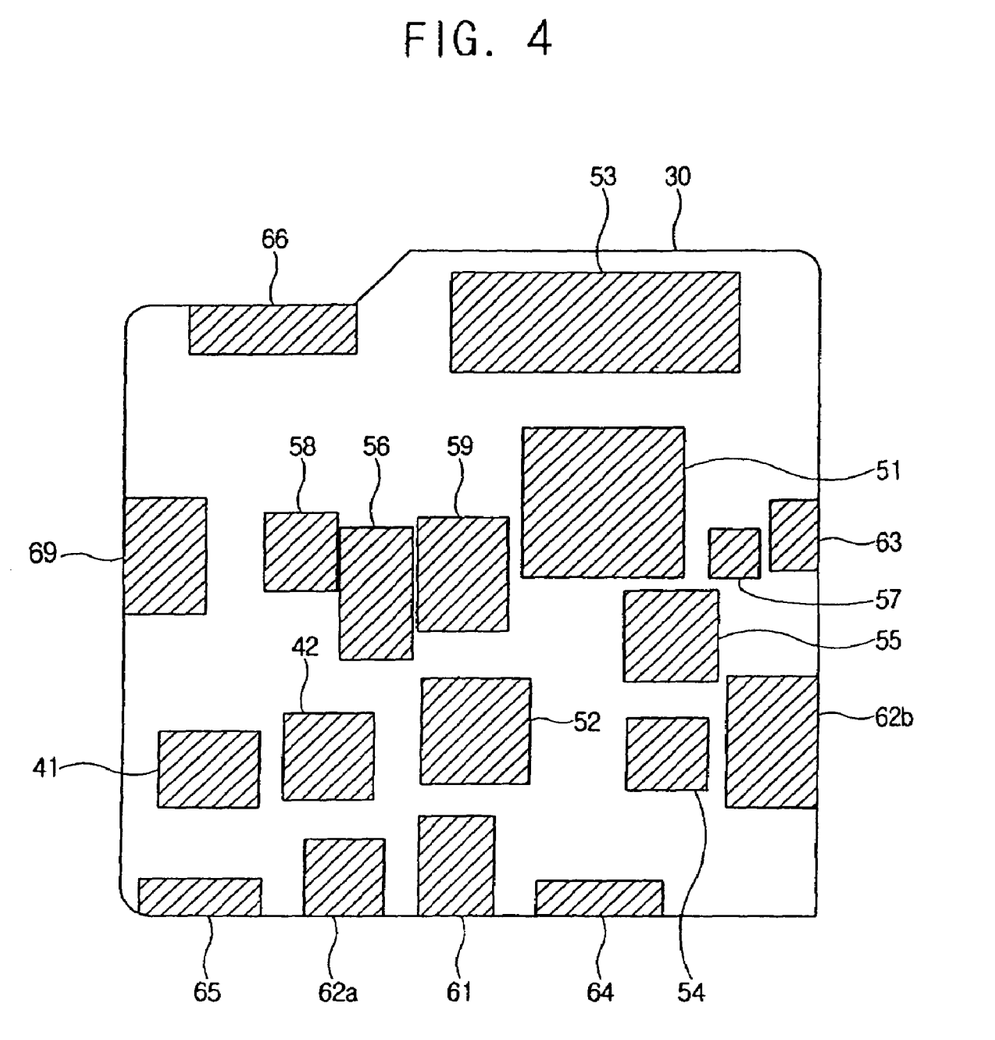
FIG. 4 is a diagram illustrating a layout of parts mounted on a first printed circuit board of the display apparatus of FIGS. 2 and 3.

The first printed circuit board 30 is disposed on the rear side of the board support frame 14 to be close to the second printed circuit board 20. On the first printed circuit board 30 is mounted the first circuit block 40 to provide image signals to the display module 13, the second circuit block 50 to process data received and to be sent through the network 2, and a plurality of input/output ports (or connectors), as illustrated in FIGS. 3 and 4. FIG. 3 illustrates a block diagram to control the first circuit block 40, the second circuit block 50, and the input/output ports mounted on the first printed circuit board 30. FIG. 4 illustrates a layout view of the first circuit block 40, the second circuit block 50, and the input/output ports mounted on the first printed circuit board 30.

Referring to FIG. 3, the first circuit block 40 includes an image signal processing unit 41 and a microcomputer 42.

The image processing unit 41 converts image signals input from an image input port 65 or the second circuit block 50 into predetermined formats that the display module 13 can use to display images, for example, a Low Voltage Differential Signaling (LVDS) format, thereby outputting the converted image signals to the display module 13 through an LVDS connector 66.

The image signal processing unit 41 may have a variety of functions to process the various formats of the input image signals. For example, the functions may include an A/D converting function, a digital decoding function, a scaling function, etc. The A/D converting function is used to convert a variety of image signal formats input from the image input port 65 or the second circuit block 50 to digital image signals with a predetermined format. The scaling function is used to control a vertical frequency, a resolution and an aspect ratio in order to meet a display output specification and/or an LVDS format conversion function.

The microcomputer 42 controls the image signal processing unit 41 and the display module 13 to adjust display characteristics of the images displayed on the display module 13. The microcomputer 42 also controls the power conversion circuit block, i.e., a DC/DC regulator, mounted on the second printed circuit board 20, thereby managing the power supplied to the whole display apparatus 1.

The second circuit block 50 may include, for example, a network control block 54, a data storage block 56, a memory block 53, a main processor 51 and a bridge block 52.

The network control block 54 is connected to the network 2 and performs data transmission and reception according to a predetermined communication protocol. The network control block 54 can be connected to the computer 3 via a local area network (LAN), and thus a LAN port 61 is mounted on the first printed circuit board 30. The network control block 54 may also be connected to the computer 3 via other connection methods, for example, an infrared (IR) communication method or a Bluetooth method which is communicable with the computer 3 to be connected to the LAN.

The data storage block 56 stores at least one control routine to process data received through the network control block 54. That is, the data storage block 56 may store an operating system to drive the second circuit block 50 and a variety of application programs to process a variety of data formats received through the network control block 54. The data storage block 56 may be a flash disc module.

The application programs include a codec program to extract graphic data which is compressed in a predetermined format and received through the network control block 54, and an execution program to execute the graphic data extracted by the codec program.

The memory block 53 serves as a main memory into which control routines of programs and data are loaded to be used in the second circuit block 50 during an operation of the main processor 51. The memory block 53 may be a synchronous dynamic random access memory (SDRAM) or a dual data rate (DDR)-SDRAM.

The main processor 51 loads to execute the control routine stored in the data storage block 56 into the memory block 53. Here, the main processor 51 may be implemented by integrating into one chip a central processing unit, a memory controller to control the memory block 53, and a graphic controller to process video signals.

The image signals output from the main processor 51 are converted into a transition minimized differential signaling (TMDS) format by a TMDS transmission block 55 and output to the image signal processing unit 41 of the first circuit block 40.

The second circuit block 50 may be driven by an operating system and application programs stored in an external computer 3 connected through the network 2, instead of being driven by the operating system and application programs stored in the data storage block 56.

For example, the main processor 51 may execute the operating system and application programs stored only in the computer 3 and may only transmit necessary data such as graphic data through the network 2. The main processor 51 receives a command via an additional input device such as a keyboard and/or a mouse connected through a USB port 62, and transmits the corresponding command to the computer 3 through the network 2, thus the main processor 51 can control the operating system and application programs in the computer 3.

The bridge block 52 manages the exchange of data between the data storage block 56 and the main processor 51. The main processor 51, the bridge block 52 and the network control block 54 can be connected via a data bus that meets a predetermined specification, for example, a peripheral component interconnect (PCI) bus, as illustrated in FIG. 3.

The second circuit block 50, in addition to the above described components, may further include an initializing routine block 58 to initialize each element in the second circuit block 50 described above upon startup, and an audio block 57 to input and output audio signals processed or to be processed by the main processor 51. The initializing routine block 58 and the audio block 57 exchange data with the main processor 51 through the bridge block 52.

Input/output ports mounted on the first printed circuit board 30 include the image input port 65, the LAN port 61, the LVDS connector 66, an image output port 64, an audio input/output port 63 and the USB port 62.

The LVDS connector 66, as described above, outputs image signals in the LVDS format, which are output from the image signal processing unit 41 to the display module 13. The first circuit block 40 and the display module 13 are connected to each other via an LVDS cable 66b, as illustrated in FIG. 5.

The image output port 64 is connected with an external image device to output the image signals output from the image processor 51 to the outside. The audio input/output port 63 serves as a path through which audio signals processed by the audio block 57 are input and output.

Hereinafter, referring to FIGS. 4 and 5, a layout of the first circuit block 40, the second circuit block 50 and the input/output ports mounted on the first printed circuit board 30 will be described in detail. For the convenience of explanation, among four sides of the first printed circuit board 30, a side nearest the second printed circuit board 20 will be referred to a first side, a side opposite to the first side will be referred to as a second side, a lower side nearest the bottom of the display apparatus 1 will be referred to as a third side, and a side opposite to the third side, i.e. a top side of the display apparatus 1, will be referred to as a fourth side.

According to the present embodiment, the second circuit block 50 is mounted at an edge portion of the second side of the first printed circuit board 30. The main processor 51 is mounted at the edge portion of the second side of the first printed circuit board 30 to be sufficiently far from the second printed circuit board 20. Accordingly, the main processor 51 and the power supply circuit devices of the second printed circuit board 20, which generate a large amount of heat in operation, are separated, so that the heat generated from the respective ones of first and second printed circuit boards 30 and 20 can be distributed over the entire display apparatus 1.

The network control block 54, the data storage block 56, the memory block 53, the initializing routine block 58, and the TMDS transmission block 55 which constitute some of the components of the second circuit block 50 mounted on the first printed circuit board 30 to be close to the main processor 51.

Referring to FIGS. 4 and 5, the TMDS transmission block 55 is mounted on the first printed circuit board 30 at a lower right side of the main processor 51, and the network control block 54 is mounted on the first printed circuit board 30 under the TMDS transmission block 55. The data storage block 56 and the initializing routine block 58 are sequentially mounted on the first printed circuit board 30 and on the left side of the main processor 51. The bridge block 52 is mounted on the first printed circuit board 30 at a lower left side of the main processor 51. The audio block 57 is mounted on the first printed circuit board 30 to the right side of the main processor 51 to be close to the audio input/output port 63. The memory block 53 is mounted on the upper side of the main processor 51, that is, at an edge portion of the fourth side of the first printed circuit board 30.

The image signal processing unit 41 and the microcomputer 42 of the first circuit block 40 are mounted on the left side of the first printed circuit board 30, that is, on the lower edge portion of the first side of the first printed circuit board 30.

The input/output ports, for example, the LAN port 61, the USB ports 62a and 62b, the audio in/out port 63, the image output port 64, the image input port 65, and connector 66, are each mounted along the edge portion of the four sides of the first printed circuit board 30. The power input connector 69 to receive the power from the second printed circuit board 20 is mounted on the edge portion of the first side of the first circuit board 30 to be close to the second printed circuit board 20. The power input connector 69 is connected to the power output connector 22 mounted on the second printed circuit board 20 via a power cable 23.

Referring to FIG. 4, at the edge portion of the third side of the first printed circuit board 30, the image input port 65, a main USB port 62a, the LAN port 61 and the image output port 64 are mounted in that order from the left to the right. Here, the positions of the image input port 65, the main USB port 62a, the LAN port 61 and the image output port 64 can be changed.

At the edge portion of the second side of the first printed circuit board 30, the audio input/output port 63 is mounted to be close to the audio block 57, and a redundancy USB port 62b is also mounted.

At the edge portion of the fourth side of the first printed circuit board 30, the LVDS connector 66 is mounted and connected to an LVDS input connector 66a disposed on the rear surface of the display module 13 via an LVDS cable 66b, thereby outputting the image signals in the LVDS format from the image signal processing unit 41 to the display module 13.

Figure 6:
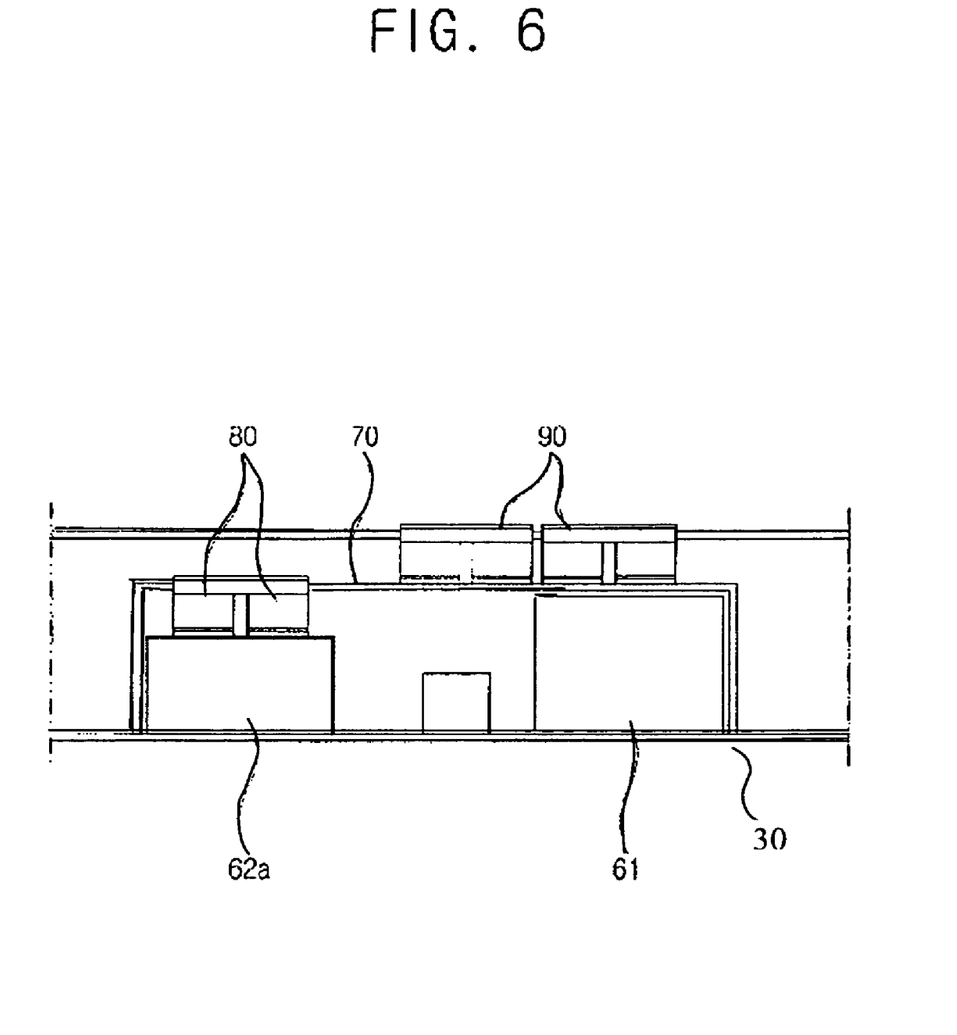
FIGS. 6 and 7 are diagrams illustrating a structure to ground the display apparatus of FIGS. 1 and 2.
Figure 7:
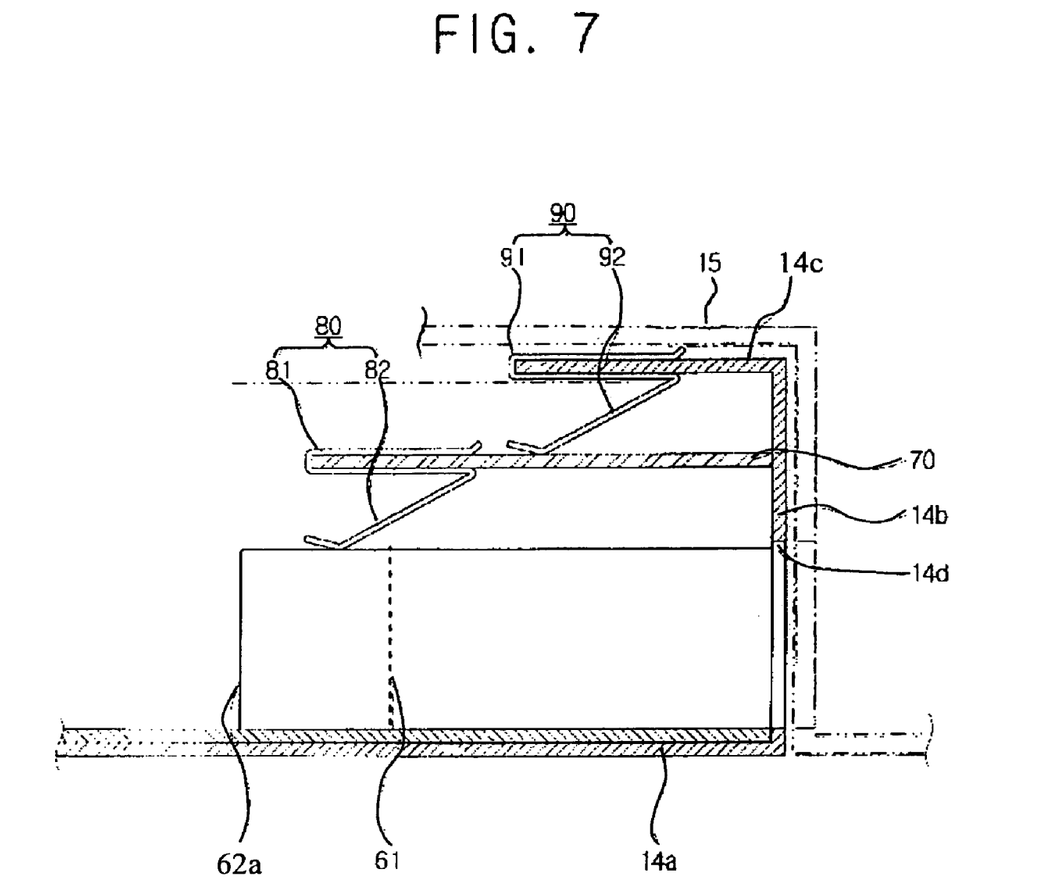

Referring to FIGS. 6 and 7, a grounding structure of the first printed circuit board 30 according to an embodiment of the general inventive concept will now be described. In explanation of the grounding structure, a grounding structure for the LAN port 61 and the USB port 62a mounted on the first printed circuit board 30 is exemplified.

As described above, the LAN port 61 is projected from the surface of the first printed circuit board 30 at the edge portion of the third side of the first printed circuit board 30, and the USB port 62a is also projected from the surface of the first printed circuit board 30 with a different height from the height of the LAN port 61. For example, the height of the USB port 62a may be less than that of the LAN port 61. Hereinafter, the LAN port 61 is referred as a first connection port 61 and the USB port 62a is referred as a second connection port 62a for the convenience of explanation.

The display apparatus 1 according to the present embodiment includes a grounding bracket 70 combined with the first printed circuit board 30 in such a way that it surrounds the first connection port 61 and the second connection port 62a. The grounding bracket 70 is in contact with a planar surface of the first connection port 61, while being combined with the first printed circuit board 30. The grounding bracket 70 has a cross-section shaped like a symbol "U". Both end portions of the grounding bracket 70 are combined with the first printed circuit board 30, and a planar middle portion of the grounding bracket 10 is in contact with the first connection port 61.

The display apparatus 1 according to the present embodiment includes a first grounding plate 90 and a second grounding plate 80.

The second grounding plate 80 is arranged between the grounding bracket 70 and the second connection port 62a and is in contact with the grounding bracket 70 and the second connection port 62a. The second grounding plate 80 includes a second clip portion 81 combined with the grounding bracket 70 in such a way that a planar portion of the grounding bracket 70 is inserted into the second clip portion 81, and a second contact portion 82 to extend from the second clip portion 81 toward the second connection port 62a.

The second clip portion 81 has a cross-section shaped like the symbol "U" as illustrated in FIG. 7, and the grounding bracket 70 is inserted between planar portions thereof by an elastic force.

The second contact portion 82 is formed to extend from the second clip portion 81 and is in contact with the second connection port 62a while the clip portion 81 is combined with the grounding bracket 70. As a result, the second connection port 62a is grounded to the grounding bracket 70 through the second grounding plate 80. An end portion of the second contact portion 82 may be bent to ensure contact with second connection port 62a as illustrated in FIG. 7.

The board support frame 14 according to the present embodiment, as illustrated in FIGS. 6 and 7, may include a base plate portion 14a on which the first printed circuit board 30 is seated, an extended plate portion 14b formed by being bent from the base plate portion 14a and having port holes 14d through which the first contact port 61 and the second contact port 62b are exposed. The extended plate portions 14b may have a bent portion 14c at its end portion being bent toward the first printed circuit board 30.

The first grounding plate 90 includes a first clip portion 91 combined with the board support frame 14 while a planar portion of the bent portion 14c is inserted therein, and a first contact portion 92 to extend from the first clip portion 91 toward the grounding bracket 70. The first contact portion 92 of the first grounding plate 90 comes into contact with the grounding bracket 70 while the first clip portion 91 is combined with the bent portion 14c.

Here, the structure of the first clip portion 91 and the first contact portion 92 of the first grounding plate 90 is similar to that of the second clip portion 81 and the second contact portion 82 of the second grounding plate 80. Accordingly, any further description thereof will be omitted.

The first clip portion 91 of the first grounding plate 90 comes into contact with the shielding cover 15 arranged on the first printed circuit board 30. The first connection port 61 is grounded to the shielding cover 15 through the first grounding plate 90 by being in contact with the grounding bracket 70, and the second connection port 62a can be grounded to the shielding cover 15 through the second grounding plate 80, the grounding bracket 70 and the first grounding plate 90.

According to the present embodiment, the height difference between the first connection port 61 and the second connection port 62a can be compensated by the grounding bracket 70. Further, the grounding structure can be easily combined to the first printed circuit board 30 because the first connection port 61 and the second connection port 62a can be grounded as the first grounding plate 90 and the second grounding plate 80 are combined with the grounding bracket 70 and/or the bent portion 14c of the board support frame 14 by a simple insertion joint.

Further, the first grounding plate 90 also can come into contact with the shielding cover 15 as the first clip portion 91 of the first grounding plate 90 is combined with the grounding bracket 70, and the first contact portion 92 is formed to extend from the first clip portion 91 toward the shielding cover 15.

As described above, the display apparatus 1 is provided with the grounding structure which is capable of compensating the height difference of the first and second connection ports 61 and 62a, which are mounted with different projected heights, and easily grounding the connection ports 61 and 62a.

Further, the present general inventive concept provides a display apparatus having a network function by which data transmission/reception can be performed using one printed circuit board on which the first circuit block 40 is used to process image signals and the second circuit block 50 is used to process data received or transmitted through a network are mounted.

Furthermore, the present general inventive concept provides the display apparatus 1 in which the first circuit block 40 and the second block 50 are mounted on the first printed circuit board 30 and the likelihood of overheating is effectively reduced.

Although a few exemplary embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A display apparatus having a display module to display images, comprising:
    a board support frame arranged at a rear side of the display module;
    a second printed circuit board attached to a rear surface of the board support frame and provided with a plurality of power supply circuit devices; and
    a first printed circuit board attached to the rear surface of the board support frame near the second printed circuit board, having a first side disposed adjacent to the second printed circuit board and a second side opposite to the first side, and further having a first circuit block disposed on a surface of the first printed circuit board to supply image signals to the display module and a second circuit block disposed on the surface of the first printed circuit board to process data received and transmitted through a network to correspond to the image signals, the second circuit block being arranged on the first printed circuit board from an edge portion of the second side opposite to the first side of the first printed circuit board.

2. The display apparatus according to claim 1, wherein the second circuit block comprises:
    a network control block connected to a network to transmit and receive data according to a predetermined communication protocol;

a data storage block which stores at least one control routine to process the data received and transmitted through the network control block;

a memory block into which the control routine is loaded;

a main processor to load the control routine into the memory block and to execute the control routine; and a bridge block to manage an exchange of data between the main processor and the data storage block.

3. The display apparatus according to claim 2, wherein the main processor is arranged at a position adjacent to the second side of the first printed circuit board.

4. The display apparatus according to claim 3, wherein the main processor converts the data received through the network control block to video signals, and outputs the video signals to the first circuit block.

5. The display apparatus according to claim 4, wherein the first printed circuit board comprises a LAN port mounted on an edge portion of a third side thereof to be connected to an external LAN connector and at least one USB port mounted on the edge portion of at least one of the second side and the third side thereof to be connected to an external device supporting a USB interface.

6. The display apparatus according to claim 5, wherein the first printed circuit board comprises an image input port mounted on the edge portion of the third side thereof to receive input image signals input to the first circuit block, and an image output port mounted on the edge portion of the third side thereof to output image signals from the first circuit block to an outside of the first printed circuit board.

7. The display apparatus according to claim 6, wherein the first printed circuit board comprises an LVDS output connector mounted on an edge portion of a fourth side thereof to transmit the image signals from the first circuit block to the display module.

8. The display apparatus according to claim 3, wherein:

the second circuit block comprises an initializing routine block to initialize the second block when the initializing power is inputted thereto and a TMDS transmission block to convert image signals output from the main processor in a TMDS format and output the converted image signals to the first circuit block; and the network control block, the data storage block, the memory block, the initializing routine block and the TMDS transmission block are mounted on the first printed circuit board adjacent to the main processor.

* * * * *